United States Patent
Broekaart et al.

(10) Patent No.: US 12,230,533 B2
(45) Date of Patent: Feb. 18, 2025

(54) METHOD FOR MANUFACTURING A SEMICONDUCTOR-ON-INSULATOR SUBSTRATE

(71) Applicant: Soitec, Bernin (FR)

(72) Inventors: Marcel Broekaart, Theys (FR); Arnaud Castex, Grenoble (FR)

(73) Assignee: Soitec, Bernin (FR)

( * ) Notice: Subject to any disclaimer, the term of this patent is extended or adjusted under 35 U.S.C. 154(b) by 567 days.

(21) Appl. No.: 17/435,017

(22) PCT Filed: Mar. 26, 2020

(86) PCT No.: PCT/EP2020/058529
§ 371 (c)(1),
(2) Date: Aug. 30, 2021

(87) PCT Pub. No.: WO2020/201003
PCT Pub. Date: Oct. 8, 2020

(65) Prior Publication Data
US 2022/0139768 A1    May 5, 2022

(30) Foreign Application Priority Data

Mar. 29, 2019   (FR) ..................................... 1903387

(51) Int. Cl.
*H01L 21/762*    (2006.01)
(52) U.S. Cl.
CPC .............................. *H01L 21/76254* (2013.01)
(58) Field of Classification Search
CPC ................. H01L 21/185; H01L 21/187; H01L 21/76251–76259
See application file for complete search history.

(56) References Cited

U.S. PATENT DOCUMENTS

2007/0087531 A1    4/2007  Kirk et al.
2008/0200008 A1    8/2008  Kerdiles et al.
(Continued)

FOREIGN PATENT DOCUMENTS

FR          2894067        2/2008
JP       2003-347385 A    12/2003
(Continued)

OTHER PUBLICATIONS

Singapore Written Opinion for Application No. 11202109934R dated Jul. 21, 2023, 29 pages.
(Continued)

*Primary Examiner* — Eric A. Ward
*Assistant Examiner* — Nora T. Nix
(74) *Attorney, Agent, or Firm* — TraskBritt

(57) ABSTRACT

A method for fabricating a semiconductor-on-insulator structure involves providing a donor substrate comprising a weakened zone delimiting a layer to be transferred, providing a receiver substrate, and bonding the donor substrate to the receiver substrate. The layer to be transferred is located on the bonding-interface side. A bonding wave is initiated at a first region on the periphery of the interface, and the wave is propagated toward a second region on the periphery of the interface opposite the first region. The difference in speed of propagation of the bonding wave between a central portion of the interface and a peripheral portion of the interface is controlled such that the speed of propagation of the bonding wave is lower in the central portion than in the peripheral portion. The donor substrate is detached along the weakened zone to transfer the layer to be transferred to the receiver substrate.

10 Claims, 7 Drawing Sheets

(56) References Cited

U.S. PATENT DOCUMENTS

| | | | | |
|---|---|---|---|---|
| 2010/0330779 | A1* | 12/2010 | Okuno | H01L 21/76254 |
| | | | | 257/E21.568 |
| 2013/0105061 | A1* | 5/2013 | Castex | H01L 21/76251 |
| | | | | 156/60 |
| 2015/0079759 | A1 | 3/2015 | Rieutord | |
| 2015/0210057 | A1* | 7/2015 | Wagenleithner | H01L 21/2007 |
| 2015/0214082 | A1* | 7/2015 | Huang | H01L 21/76251 |
| | | | | 438/457 |
| 2019/0267238 | A1* | 8/2019 | Mitsuishi | H01L 21/185 |

FOREIGN PATENT DOCUMENTS

| | | |
|---|---|---|
| JP | 2009-517855 A | 4/2009 |
| JP | 2010-518639 A | 5/2010 |
| JP | 2013-531395 A | 8/2013 |

OTHER PUBLICATIONS

International Search Report for International Application No. PCT/EP2020/058529 dated Jul. 23, 2020, 2 pages.
International Written Opinion for International Application No. PCT/EP2020/058529 dated Jul. 23, 2020, 6 pages.
Rieutord et al., Dynamics of a Bonding Front, Physical Review Letters, vol. 94, (2005), 4 pages.
Japanese Notice of Reasons for Rejection for Application No. 2021-557505 dated Mar. 26, 2024, 5 pages.

* cited by examiner

METHOD FOR MANUFACTURING A SEMICONDUCTOR-ON-INSULATOR SUBSTRATE

CROSS-REFERENCE TO RELATED APPLICATIONS

This application is a national phase entry under 35 U.S.C. § 371 of International Patent Application PCT/EP2020/058529, filed Mar. 26, 2020, designating the United States of America and published as International Patent Publication WO 2020/201003 A1 on Oct. 8, 2020, which claims the benefit under Article 8 of the Patent Cooperation Treaty to French Patent Application Serial No. FR1903387, filed Mar. 29, 2019.

TECHNICAL FIELD

The present disclosure relates to a process for fabricating a semiconductor-on-insulator structure by transferring a layer from a first substrate, referred to as the "donor substrate," to a second substrate, referred to as the "receiver substrate."

BACKGROUND

Semiconductor-on-insulator structures are multilayer structures comprising a carrier substrate, an electrically insulating layer arranged on top of the carrier substrate, which is generally a layer of oxide such as a layer of silicon oxide, and a semiconductor layer arranged on top of the insulating layer, in which operational zones of the structure are produced.

Semiconductor-on-insulator (SeOI) structures are referred to as "silicon-on-insulator" (SOI) structures when the semiconductor is silicon. One known method used for fabricating this type of structure is the SMART CUT® method, which involves forming a weakened zone in a first semiconductor substrate, referred to as the "donor substrate," so as to delimit a semiconductor layer to be transferred. The weakened zone is formed in the donor substrate at a predefined depth that corresponds substantially to the thickness of the layer to be transferred.

The layer to be transferred is next transferred to a second semiconductor substrate, which is referred to as the "receiver substrate" or "carrier substrate," by bonding the donor substrate to the receiver substrate via the layer to be transferred and then detaching the donor substrate along the weakened zone.

The donor substrate may be detached by thermally annealing the structure formed by the donor substrate and the receiver substrate. This type of detachment is commonly called "thermal splitting," referred to by its acronym "T-split."

The initiation of the splitting wave is determined by the maturation of various zones within the donor substrate and the receiver substrate in the vicinity of the weakened zone. The temperature within the donor substrate and the receiver substrate is non-uniform, such that zones of high temperature, referred to as hot zones, and zones of lower temperature, referred to as cool zones, form. These differences in temperature result in differences in maturation between the hot zones and the cool zones, i.e., the hot zones mature faster than the cool zones.

The splitting wave is initiated once the hot zones have matured sufficiently.

However, differences in temperature and in maturation within the material of the donor substrate and of the receiver substrate create a pattern of roughness on the exposed surface of the SeOI substrate obtained after detaching the donor substrate, and also limit control of detachment due to the energy released by the hot zones that have reached maturity. It is then necessary to use smoothing treatments, such as RTA (rapid thermal annealing), later on in order to decrease the high degree of roughness of the free surface of the structure after detachment, which results in higher production costs in addition to increasing the production time.

Thermal splitting also has several other drawbacks. In particular, when the donor substrate and/or the receiver substrate comprise electronic components, these components may be damaged when they are subjected to high temperatures, which substantially limits the fabrication of certain SeOI substrates.

BRIEF SUMMARY

One object of the present disclosure is to overcome the drawbacks described above.

The present disclosure aims, in particular, to provide a process for fabricating a semiconductor-on-insulator substrate by transferring a layer from a donor substrate to a receiver substrate, which allows the roughness of the exposed surface of the SeOI substrate obtained after detaching the donor substrate to be decreased.

Another object of the present disclosure is to provide such a process allowing the constraints resulting from thermal splitting to be overcome; in particular, to provide a more economical process that is compatible with the fabrication of a greater variety of SeOI substrates.

For this reason, the present disclosure relates to a process for fabricating a semiconductor-on-insulator structure, comprising the following steps:
    providing a donor substrate comprising a weakened zone delimiting a layer to be transferred;
    providing a receiver substrate;
    bonding the donor substrate to the receiver substrate, the layer to be transferred being located on the bonding-interface side, by initiating a bonding wave at a first region on the periphery of the interface and propagating the wave toward a second region on the periphery of the interface opposite the first region, the propagation speed of the bonding wave is lower in the central portion than in the peripheral portion; and
    detaching the donor substrate along the weakened zone in order to transfer the layer to be transferred to the receiver substrate.

The process is characterized in that the bonding is implemented in controlled conditions to increase the speed difference of propagation of the bonding wave between the peripheral portion and the central portion of the bonding interface.

According to other aspects, the proposed process has the following various features, which may be implemented alone or in technically feasible combinations thereof:
    the increase in the difference of the speed of propagation of the bonding wave is sufficient to form a gaseous inclusion in the second region on the periphery of the bonding interface;
    the detachment of the donor substrate is initiated at the site of the gaseous inclusion;
    the controlled bonding conditions comprise the positioning of the donor substrate and/or the receiver substrate, prior to bonding, on a supporting surface of a holder, the supporting surface having a zone that is raised relative to the rest of the supporting surface, the exposed surface of the donor substrate and/or of the receiver substrate that is intended to form the bonding interface being at least partially shaped to match the supporting surface of the holder so as to have a zone that is raised relative to the rest of the exposed surface;

the raised zone of the exposed surface of the donor substrate and/or of the receiver substrate is raised relative to the rest of the exposed surface by 15 µm to 150 µm;

the controlled bonding conditions comprise the selective application of a plasma to the exposed surface of the donor substrate and/or of the receiver substrate that is intended to form the bonding interface, the amount of plasma applied to the peripheral portion of the exposed surface being larger than that applied to the central portion of the exposed surface; and the weakened zone is formed by implanting atomic species into the donor substrate.

BRIEF DESCRIPTION OF THE DRAWINGS

Other advantages and features of the present disclosure will become apparent upon reading the following description given by way of illustrative and non-limiting example, with reference to the following accompanying figures.

DETAILED DESCRIPTION

The present disclosure relates to a process for fabricating a semiconductor-on-insulator structure in which a first substrate, referred to as the "donor substrate," is bonded to a second substrate, referred to as the "receiver substrate." The donor substrate comprises a weakened zone that delimits the layer to be transferred.

During bonding, the layer to be transferred is brought into contact with the free surface of the receiver substrate such that the free surface of the layer to be transferred and the free surface of the receiver substrate form the bonding interface.

A heat treatment may be carried out to increase the bonding energy between the two substrates.

The donor substrate is then detached along the weakened zone. A fracture is initiated and then propagated at the site of the weakened zone, which by definition is a weaker zone of the donor substrate. The layer delimited at the surface of the donor substrate is thus transferred to the receiver substrate. The fracture may be triggered spontaneously by heating the assembly of substrates to a given temperature, or it may be triggered by applying a mechanical stress to the donor substrate.

The layer transfer method may be, in particular, the SMART CUT™ method, in which the weakened zone is created by implanting atomic species, in particular, hydrogen and/or helium atoms, into the donor substrate at a depth determined by the implantation parameters, which corresponds substantially to the thickness of the layer to be transferred. A person skilled in the art is able to determine the implantation parameters, in particular, the nature of the atomic species, the dose and the energy of the species, in order to implant the atomic species into the donor substrate at the desired depth.

The SMART CUT™ method is advantageous since it makes it possible to reuse the donor substrate after transferring the layer for other subsequent applications and makes it possible to transfer thin layers uniformly.

When bonding the donor substrate to the receiver substrate, the two substrates are brought into contact at their peripheries. The contact zone between the donor and receiver substrates is the site at which a bonding wave is initiated and constitutes a first peripheral region of the bonding interface.

The donor substrate and the receiver substrate are brought together so that they cover one another from the first peripheral region of the bonding interface. The bonding wave moves along the bonding interface formed by the respective free surfaces of the donor substrate and of the receiver substrate that are in contact, from the first region on the periphery of the interface to a second region on the periphery of the interface opposite the first region relative to a median plane perpendicular to the joined substrates. In other words, if the substrates are disc-shaped, the second region is diametrically opposite the first region and is the site at which the bonding wave ends.

Figure 1:
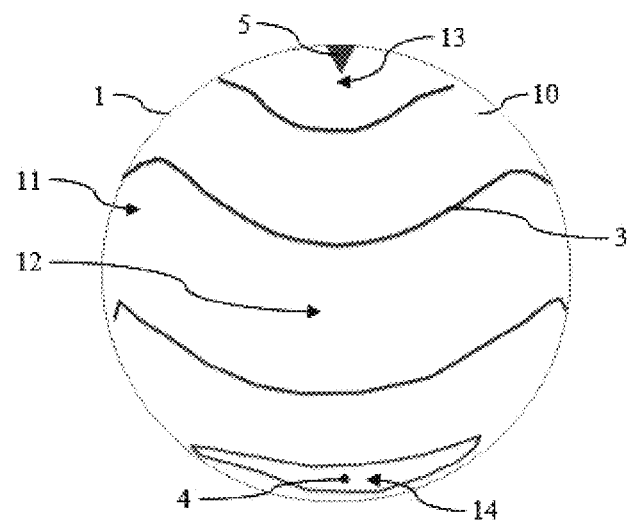
FIG. 1 schematically shows a view from above that illustrates the propagation of a bonding wave at the bonding interface.

The fabrication process of the present disclosure is based on the following experimental observation, illustrated by FIG. 1. As illustrated in FIG. 1, when bonding the donor substrate 1 to the receiver substrate 2, the bonding wave 3 propagates faster at the periphery 11 of the bonding interface 10 than in the central portion 12 of the interface.

The periphery 11 of the bonding interface corresponds to the portion of the interface that is located between the edge of the donor substrate and the edge of the receiver substrate, which runs between the site 13 at which the bonding wave is initiated and the site 14 at which the bonding wave ends. The central portion 12 of the bonding interface corresponds to a region in the vicinity of the center of the two joined substrates, which runs between the site 13 at which the bonding wave is initiated and the site 14 at which the bonding wave ends. If Vp denotes the speed of the bonding wave at the periphery of the bonding interface and Vc denotes the speed of the bonding wave at the center of the bonding interface, then there is a relation of proportionality between Vp and Vc that is defined by the following relationship: Vp=1.585*Vc (1).

The difference in the speed of the bonding wave 3 between the central portion 12 and the peripheral portion 11 of the bonding interface is mainly due to the fact that, when the donor substrate 1 and the receiver substrate 2 are brought together, the volume of air located between the two substrates is evacuated faster from the peripheral portion than from the central portion of the interface. However, the distance that the bonding wave has to cover is greater at the peripheral portion than at the central portion of the bonding interface.

Thus, the bonding wave 3 takes substantially the same time to reach the end site 14 whether it propagates through the central portion 12 or around the periphery 11 of the bonding interface 10.

Surprisingly, it has been observed that by increasing the difference in the speed of propagation of the bonding wave between the peripheral portion 11 and the central portion 12 of the bonding interface, the later detachment of the donor substrate 1 is facilitated, resulting in a decrease in the roughness of the free surface of the semiconductor structure obtained.

Preferably, returning to the preceding relationship (1), the difference in the speed of the bonding wave between the peripheral portion and the central portion of the bonding interface is increased according to the following relationship (2): Vp>1.585*Vc (2).

When the difference in the speed of propagation of the bonding wave 3 between the peripheral portion 11 and the central portion 12 of the bonding interface is increased, in particular, by satisfying relationship (2), an inclusion 4 of gas, in particular, of air, forms at the site of the second region on the periphery of the bonding interface. The gaseous inclusion therefore forms at the bonding interface, at the site 14 at which the bonding wave ends, opposite the initiation site 13.

It has been empirically observed that the gaseous inclusion forms between 2.5 mm and 4 mm from the edge of the bonding interface.

Such an inclusion is not observed in a conventional bonding process.

In FIG. 1, a gaseous inclusion 4 is shown on the periphery of the receiver substrate 2 and is diametrically opposite a notch 5 at which substrate bonding is initiated. Such a notch is well known in the field of semiconductor substrates and is used as a reference for the relative positioning of the substrates. The movement of the bonding wave is schematically represented by the curved lines 3, where the peak of the curve points in the direction of the end site 14 where the gaseous inclusion is located.

When bonding is carried out in the presence of one or more gases other than air, such as nitrogen or argon, these gases may also be trapped in the gaseous inclusion.

The presence of one or more gaseous inclusions 4 at the bonding interface 10 facilitates the later detachment of the donor substrate. More specifically, gaseous inclusions destabilize the bonding interface. Thus, when detachment is initiated, in particular, by means of thermal annealing and/or mechanical stress, the gaseous inclusions constitute preferred fracture zones. The fracture is initiated at the site of the weakened zone on the periphery of the donor substrate, and it then propagates along the weakened zone. In parallel, the fracture is also initiated at the site of the gaseous inclusions and propagates from the gaseous inclusions toward the weakened zone, resulting in a synergistic effect that optimizes the fracturing of the donor substrate at the weakened zone.

The mechanical stresses at the weakened zone are lower in comparison with the known processes in which the speed of propagation of the bonding wave is not controlled according to the process of the present disclosure, resulting in an improvement, i.e., a decrease, in the roughness of the free surface of the semiconductor structure obtained after detaching the donor substrate.

Figure 2:
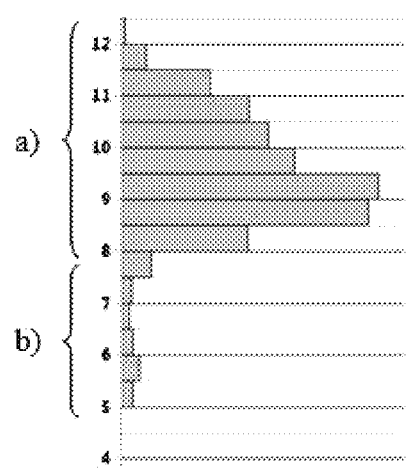
FIG. 2 is a haze graph obtained by means of laser diffraction at the surface of two semiconductor structures obtained after detachment and thermal smoothing by thermal annealing.

This improvement in roughness may be observed in the roughness graph illustrated in FIG. 2, referred to as a haze graph, which is obtained by means of laser diffraction at the surface of two semiconductor structures obtained after detachment and thermal smoothing by thermal annealing. A first structure a) is obtained by carrying out a fabrication process according to the prior art, referred to as a "T-split," and a second structure b) is obtained by carrying out the fabrication process of the present disclosure b), referred to as a "D-split."

The haze measured at the surface of structure a) is very non-uniform. This is illustrated in the graph by the substantial and dominant presence of a haze equal to about 9, relatively substantial between 8 and 9 and between 9 and 11, and less substantial between 7 and 8 and between 11 and 12.

The haze measured at the surface of structure b) is significantly more uniform. This is illustrated in the graph by a haze that is less substantial and distributed more or less equally between 5 and 7.

Figure 3A:
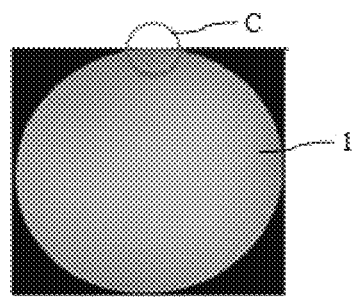
FIG. 3A is a view from above of a donor or receiver substrate illustrating the location of a gas inclusion.
Figure 3B:
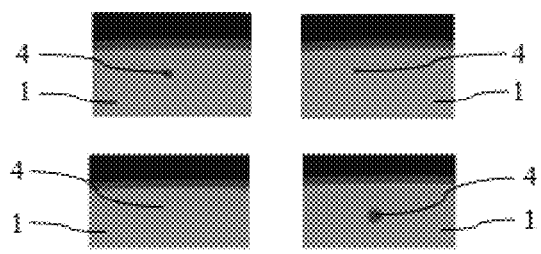
FIG. 3B shows four substrates from above, with four gaseous inclusions at the bonding interface.

FIGS. 3A and 3B illustrate the positions of several gaseous inclusions 4. FIG. 3A shows that the gaseous inclusions are located on the periphery 11 of the bonding interface. The gaseous inclusions are circled by C. In particular, in FIG. 3B, the gaseous inclusions 4 are located close to the edge of the bonded substrates, at the bonding interface 10.

Figure 4:
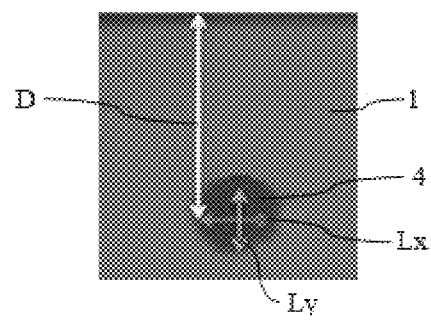
FIG. 4 is a close-up view of a gas inclusion illustrating its dimensions.

FIG. 4 schematically shows the dimensions Lx and Ly of a gaseous inclusion 4 along two axes x and y that are perpendicular to one another and parallel to the plane of the bonding interface 10, and its distance D relative to the edge of the substrate. The corresponding values are given in the table below. The area S of the inclusion and the haze are also given. Measurements have been taken for several gas inclusions. The table gives the minimum (min) and maximum (max) average values of the various characteristics of these gas inclusions.

TABLE 1

Table: characteristics of several gas inclusions

|  | Lx (mm) | Ly (mm) | S (mm$^2$) | D (mm) | Haze |
| --- | --- | --- | --- | --- | --- |
| Min | 0.1894 | 0.2622 | 0.1615 | 2.7463 | 5.45 |
| Max | 1.4112 | 1.2350 | 5.1023 | 4.2570 | 6.46 |

Two embodiments that make it possible to increase the difference in the speed of propagation of the bonding wave between the peripheral portion and the central portion of the bonding interface will now be presented.

According to a first embodiment, the donor substrate 1 and/or the receiver substrate 2 are positioned, prior to bonding, on a supporting surface 21 of a holder 20 or "chuck."

Figure 5:
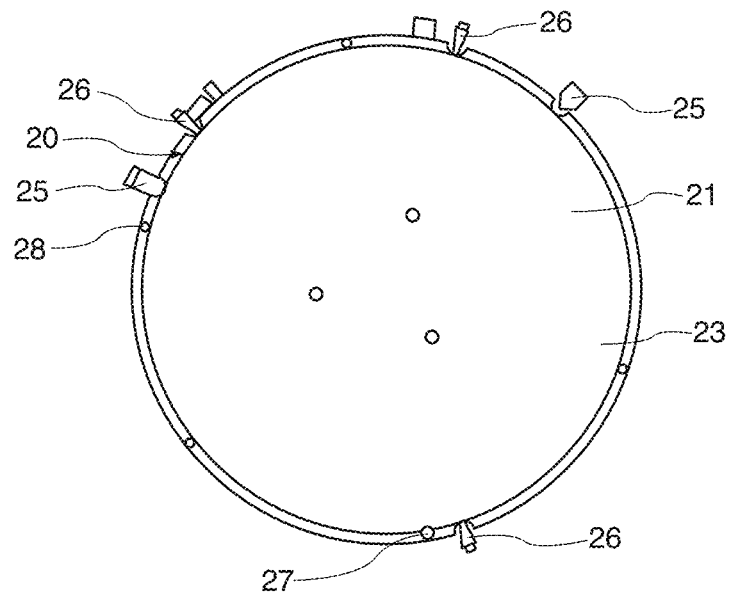
FIG. 5 is a photographic view from above of a holder, or "chuck"
Figure 6:
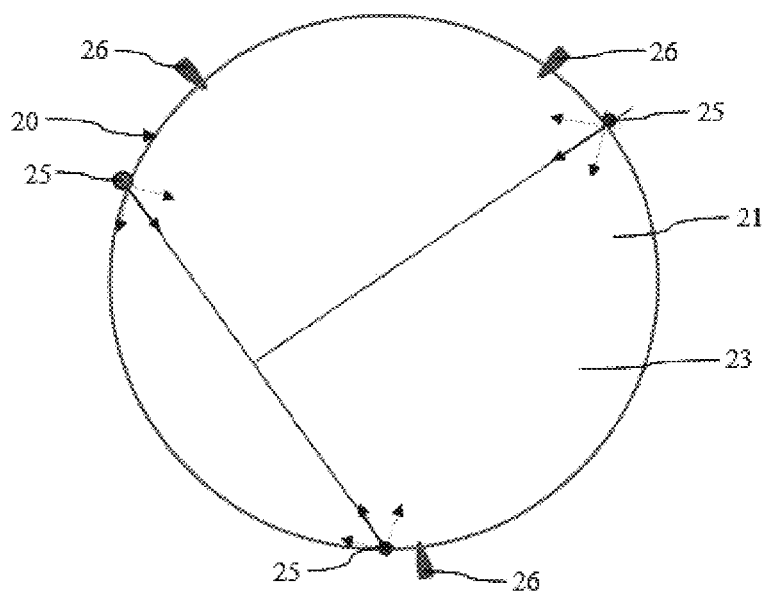
FIG. 6 is a diagram of the holder of FIG. 5.
Figure 7:
FIG. 7 is a side view of the holder of FIG. 5.
Figure 8:
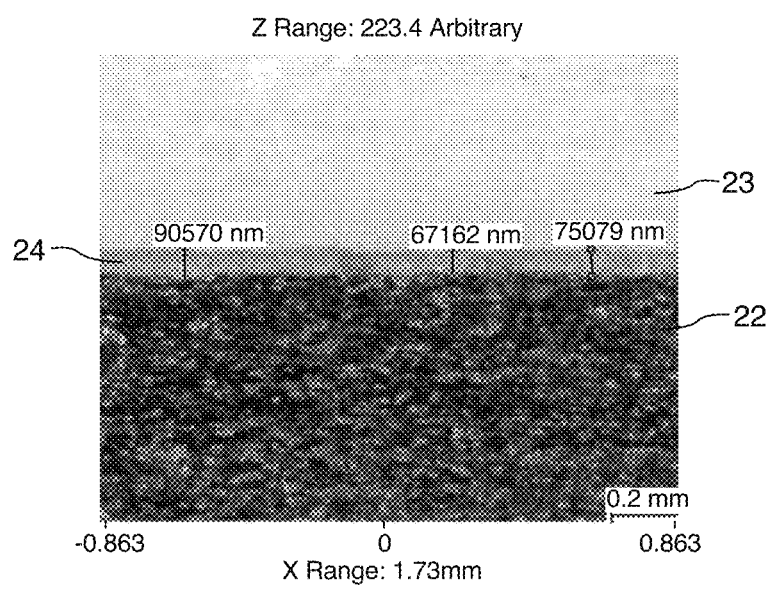
FIG. 8 is a sectional side view of the holder of FIG. 5 under an optical microscope.

Such a holder 20 is shown in a view from above in FIGS. 5 and 6 and in a side view in FIGS. 7 and 8. This holder is configured to accept a substrate, referred to as the first substrate, which may be the donor substrate 1 or the receiver substrate 2, one face of which makes contact with the supporting surface 21 of the holder. It generally comprises a metal body 22 coated with a layer of polytetrafluoroethylene (PTFE, known, in particular, by the brand name TEFLON™) 23. The layer of TEFLON™ is bonded to the body via a bonding layer 24.

The first substrate 1 is kept centered on the holder 20 by centering parts 25, referred to as "pushers," that press against the edge of the substrate.

Spacing parts 26, referred to as "spacers," allow the two substrates to be held away from one another before bonding. The spacers 26 are also shown schematically in FIGS. 9 and 10, which illustrate the positions of the first substrate 1 and of the second substrate 2 after bonding.

Figure 9:
FIG. 9 schematically shows a holder on which a donor substrate and a receiver substrate are mounted, before bonding.

With reference to FIG. 9, before bonding, the first substrate 1 is placed on the supporting surface 21 of the holder 20 and the second substrate 2 is mounted on the holder such that the surfaces of the two substrates 1, 2 that are intended to form the bonding interface face one another. The two substrates 1, 2 are kept apart from one another by the spacers 26.

The holder 20 is provided with a notch pin 27 that allows a user to position the two substrates 1, 2, with their notches 5 being used as a reference to align their positions with the notch pin 27, in addition to acting as a stop for the substrates 1, 2. A second stop 28 is also located next to one of the pushers 25. By virtue of the structure of the holder 20, the user can be sure that the two substrates 1, 2 are positioned correctly on the holder 20 for bonding.

Figure 10:
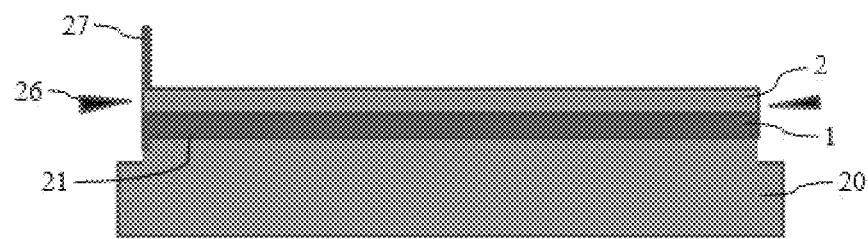
FIG. 10 schematically shows a holder on which a donor substrate and a receiver substrate are mounted, after bonding.

With reference to FIG. 10, the spacers 26 are removed in order to allow the two substrates to be bonded. The bonding initiation zone 13 (FIG. 1) is located at the site of the notch pin 27 of the holder.

According to the present disclosure, the holder 20 is deformed prior to positioning the donor substrate 1 and/or the receiver substrate 2 on its supporting surface 21. More specifically, the holder 20 is deformed such that its supporting surface 21 has a zone 29 that is raised relative to the rest of the supporting surface 21. This raised zone 29 is located at the site of the zone 14 in which the bonding wave ends, diametrically opposite the initiation zone 13 in which the bonding wave is initiated.

Figure 11:
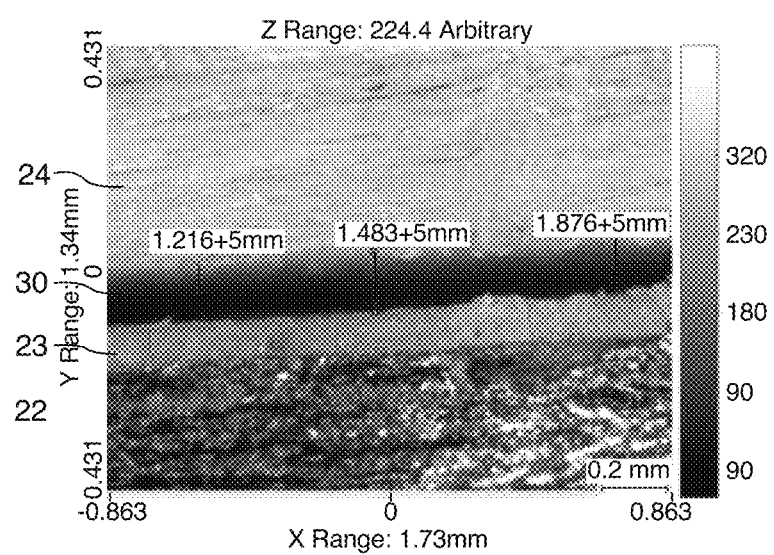
FIG. 11 is a sectional side view of the holder of FIG. 5 under an optical microscope illustrating the localized debonding of its TEFLON™ coating.

The raised zone 29 may be formed by raising the PTFE layer, as illustrated in FIG. 11. The bond dissociates locally, resulting in the formation of an air space 30 between the PTFE layer 23 and the adhesive remaining on the body 22.

Figure 12:
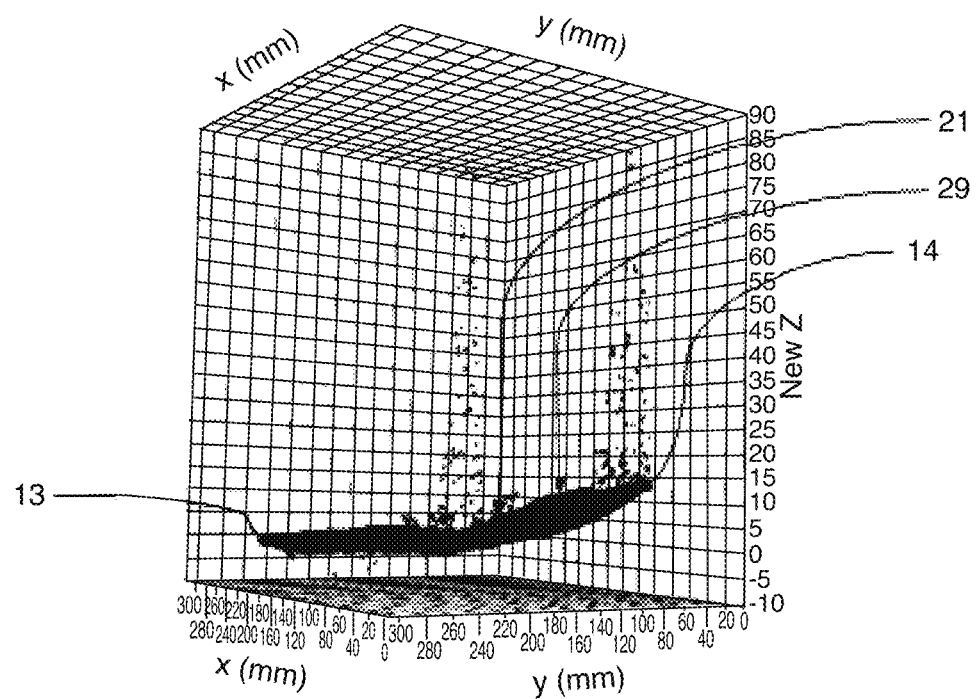
FIG. 12 is a point cloud illustrating the profile of the supporting surface of the holder after deformation, along three axes x, y and z.

FIG. 12 is a point cloud resulting from a measurement of the planarity of the holder, which illustrates the profile of the supporting surface of the holder after deformation, along three axes x, y and z. It is noted that the supporting surface 21 extends further along the z-axis at the site of the zone 14 at which the bonding wave ends than the initiation zone 13 due to the presence of the raised zone 29.

Figure 13:
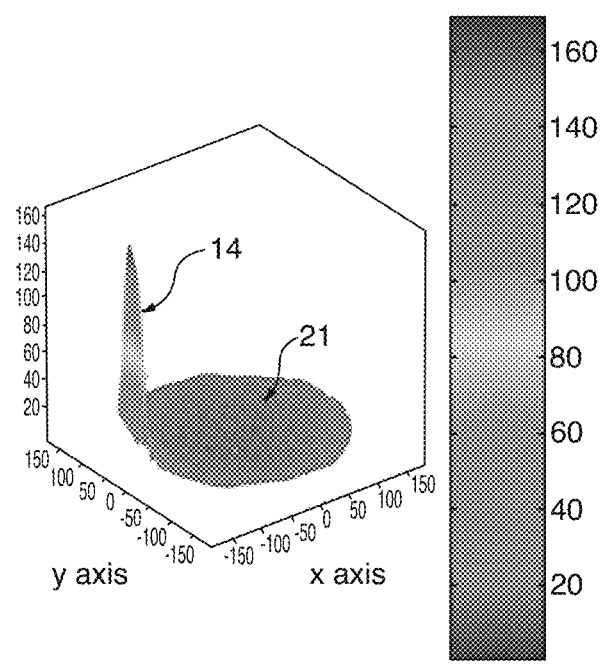
FIG. 13 is a perspective representation of a measurement of the planarity of the holder along the x, y and z axes, which illustrates the deformation of the supporting surface of the holder at the site of the zone at which the bonding wave ends.
Figure 14:
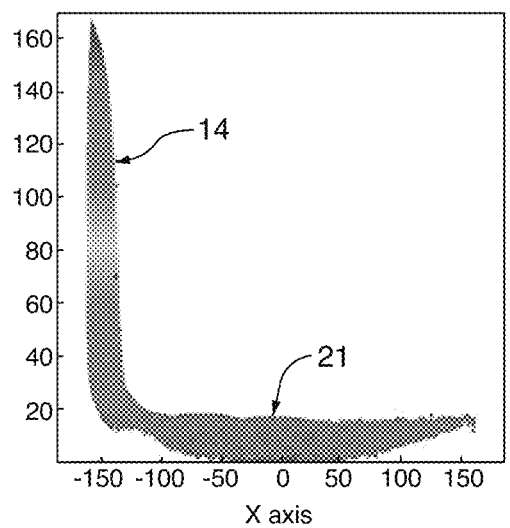
FIG. 14 is a view of FIG. 13 along the x and y axes only.

FIGS. 13 and 14 also illustrate the deformation of the supporting surface 21 of the holder at the site of the zone 14 at which the bonding wave ends, which extends up to about 160 mm in height (z-axis) versus values ranging from 0 mm to 20 mm for the rest of the supporting surface.

The first substrate, whether donor or receiver, is next placed on the supporting surface, thus deformed, of the holder. The notch 5 in the first substrate 1 is aligned with the notch pin 27 of the holder. The exposed surface of the first substrate, which is intended to form the bonding interface, is then at least partially shaped to match the supporting surface of the holder so as to have a zone 29 that is raised relative to the rest of the exposed surface.

The raised zone 29 of the exposed surface of the first substrate is located vertically in line with the raised zone of the supporting surface of the holder.

Preferably, the raised zone 29 of the exposed surface of the first substrate is raised relative to the rest of the exposed surface by 15 μm to 150 μm, and advantageously, preferably, by between 20 μm and 100 μm.

The first substrate 1, which remains in position on the holder 20, is then bonded to the second substrate 2. The bonding wave is initiated at the site of the notches 5 in the two substrates through contact between the substrates, and propagates along the bonding interface 10 as the substrates are brought together until reaching the raised zone 29 of the exposed surface of the first substrate.

The non-uniform profile of the supporting surface of the holder results in the corresponding formation of a non-uniform profile of the free surface of the first substrate. This change in the surface state of the free surface between the raised zone and the rest of the bonding interface increases the difference in the speed of the bonding wave between the central portion and the peripheral portion of the bonding interface. This results in the formation of gas inclusions at the bonding interface vertically in line with the raised zone of the first substrate.

According to a second embodiment, the speed of propagation of the bonding wave is controlled by selectively applying a plasma to the exposed surface of the donor substrate and/or of the receiver substrate that is intended to form the bonding interface.

The amount of plasma applied to the peripheral portion of the exposed surface of the substrate is larger than that applied to the central portion of the exposed surface.

The plasma modifies the surface state of the exposed surface and locally accelerates the bonding wave. Its non-uniform distribution increases the difference in the speed of the bonding wave between the central portion and the peripheral portion of the bonding interface, resulting in the formation of gas inclusions at the bonding interface vertically in line with the raised zone of the first substrate.

The process of the present disclosure is carried out at lower temperatures than the known processes using a high temperature thermal annealing, known as "T-splitting," which decreases the stresses in the donor and receiver substrates and decreases the roughness of the free surface of the structure after detachment. It therefore becomes possible to omit, or at least to limit, later smoothing treatments such as RTA.

The invention claimed is:

1. A method for fabricating a semiconductor-on-insulator structure, comprising the following steps:
providing a donor substrate comprising a weakened zone delimiting a layer to be transferred;
providing a receiver substrate;
bonding the donor substrate to the receiver substrate, the layer to be transferred being located on a bonding interface of the donor substrate, by initiating a bonding wave at a first region on a periphery of the bonding interface and propagating the bonding wave toward a second region on the periphery of the bonding interface opposite the first region, the propagating in a central portion of the bonding interface at a first speed $V_c$ and propagating in a peripheral portion of the bonding interface at a second speed $V_p$, wherein the bonding is implemented in controlled conditions to increase a difference between the first speed $V_c$ and the second speed $V_p$ such that $V_p > 1.585*V_c$;

forming a gaseous inclusion in the second region on the periphery of the bonding interface; and detaching the donor substrate along the weakened zone to transfer the layer to be transferred to the receiver substrate.

2. The method of claim 1, wherein the detachment of the donor substrate is initiated at a site of the gaseous inclusion.

3. The method of claim 2, wherein the bonding is implemented in controlled conditions comprising positioning of the donor substrate and/or the receiver substrate, prior to bonding, on a supporting surface of a holder, the supporting surface having a zone that is raised relative to the rest of the supporting surface, an exposed surface of the donor substrate and/or of the receiver substrate that is intended to form the bonding interface being at least partially shaped to match the supporting surface of the holder so as to have a zone that is raised relative to the rest of the exposed surface.

4. The method of claim 3, wherein the raised zone of the exposed surface of the donor substrate and/or of the receiver substrate is raised relative to the rest of the exposed surface of the donor substrate by 15 µm to 150 µm.

5. The method of claim 4, wherein the controlled conditions comprise selective application of a plasma to the exposed surface of the donor substrate and/or of the receiver substrate that is intended to form the bonding interface, the amount of the plasma applied to the peripheral portion of the exposed surface being larger than that applied to the central portion of the exposed surface.

6. The method of claim 5, wherein the weakened zone is formed by implanting atomic species into the donor substrate.

7. The method of claim 1, wherein the bonding is implemented in controlled conditions comprising positioning of the donor substrate and/or the receiver substrate, prior to bonding, on a supporting surface of a holder, the supporting surface having a zone that is raised relative to the rest of the supporting surface, an exposed surface of the donor substrate and/or of the receiver substrate that is intended to form the bonding interface being at least partially shaped to match the supporting surface of the holder so as to have a zone that is raised relative to the rest of the exposed surface.

8. The method of claim 7, wherein the raised zone of the exposed surface of the donor substrate and/or of the receiver substrate is raised relative to the rest of the exposed surface of the donor substrate by 15 µm to 150 µm.

9. The method of claim 1, wherein the bonding is implemented in controlled conditions comprising selective application of a plasma to an exposed surface of the donor substrate and/or of the receiver substrate that is intended to form the bonding interface, the amount of the plasma applied to the peripheral portion of the exposed surface being larger than that applied to the central portion of the exposed surface.

10. The method of claim 1, wherein the weakened zone is formed by implanting atomic species into the donor substrate.

* * * * *

UNITED STATES PATENT AND TRADEMARK OFFICE
CERTIFICATE OF CORRECTION

| | | |
|---|---|---|
| PATENT NO. | : 12,230,533 B2 | Page 1 of 1 |
| APPLICATION NO. | : 17/435017 | |
| DATED | : February 18, 2025 | |
| INVENTOR(S) | : Marcel Broekaart and Arnaud Castex | |

It is certified that error appears in the above-identified patent and that said Letters Patent is hereby corrected as shown below:

In the Claims

| | | | |
|---|---|---|---|
| Claim 1, | Column 8, | Line 61, | change "first region, the propagating" to --first region, the bonding wave propagating in a central-- |

Signed and Sealed this
Seventeenth Day of June, 2025

Coke Morgan Stewart
*Acting Director of the United States Patent and Trademark Office*